US006960939B2

(12) United States Patent
Ngo

(10) Patent No.: US 6,960,939 B2
(45) Date of Patent: Nov. 1, 2005

(54) LIMITED SWITCH DYNAMIC LOGIC CIRCUIT WITH KEEPER

(75) Inventor: Hung C. Ngo, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 39 days.

(21) Appl. No.: 10/655,375

(22) Filed: Sep. 4, 2003

(65) Prior Publication Data

US 2005/0052202 A1 Mar. 10, 2005

(51) Int. Cl.[7] ............................................. H03K 19/096
(52) U.S. Cl. ........................................ 326/95; 326/98
(58) Field of Search ............................. 326/93–98, 121; 327/142, 198

(56) References Cited

U.S. PATENT DOCUMENTS

| | | | | | |
|---|---|---|---|---|---|
| 5,543,731 | A | * | 8/1996 | Sigal et al. ................... 326/40 |
| 5,831,990 | A | * | 11/1998 | Queen et al. ................ 714/724 |
| 5,852,373 | A | * | 12/1998 | Chu et al. ..................... 326/98 |
| 6,404,236 | B1 | * | 6/2002 | Bernstein et al. .............. 326/98 |
| 6,496,038 | B1 | * | 12/2002 | Sprague et al. ................ 326/95 |
| 6,529,045 | B2 | * | 3/2003 | Ye et al. ........................ 326/95 |
| 6,690,204 | B1 | | 2/2004 | Belluomini et al. .......... 326/95 |
| 2004/0051560 | A1 | | 3/2004 | Belluomini et al. .......... 326/98 |

* cited by examiner

*Primary Examiner*—Daniel Chang
(74) *Attorney, Agent, or Firm*—Richard F. Frankeny; Winstead Seachrest & Minick P.C.; Casimer K. Salys

(57) ABSTRACT

An LSDL circuit has both an output and a complementary output generated by inverting the output with an inverter logic gate. A keeper PFET is added by coupling its drain terminal to the dynamic node. The keeper PFET has its source terminal coupled to the positive power supply voltage and its gate terminal coupled to the complementary output. The output and the dynamic node may both be at a logic one when the output is a logic one from the previous evaluation cycle and the dynamic node is precharged. In this case, the complementary output is a logic zero which turns ON the keeper PFET and reinforces the precharge on the dynamic node. When the output is evaluating to a logic zero, the output will transition quickly to a logic zero. If the output is transitioning from a logic zero to a logic one, then the keeper PFET is OFF and does not affect the dynamic node.

11 Claims, 7 Drawing Sheets

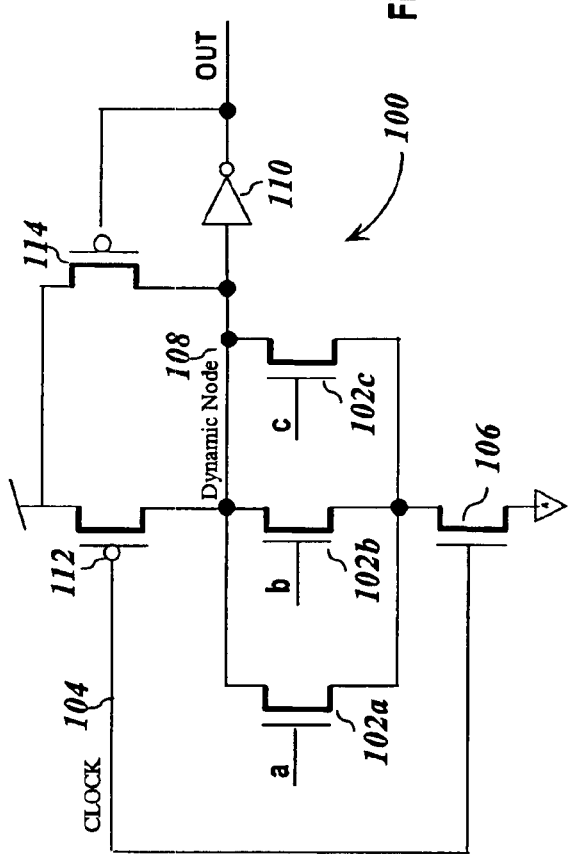
Fig. 1.1
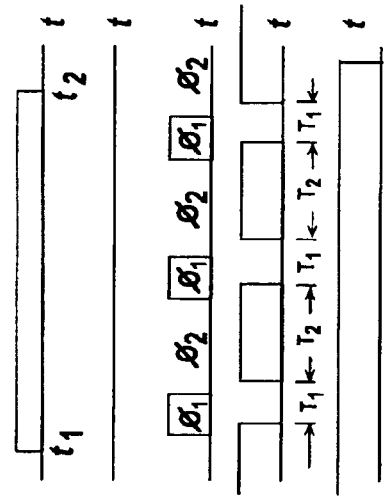
Fig. 2.3
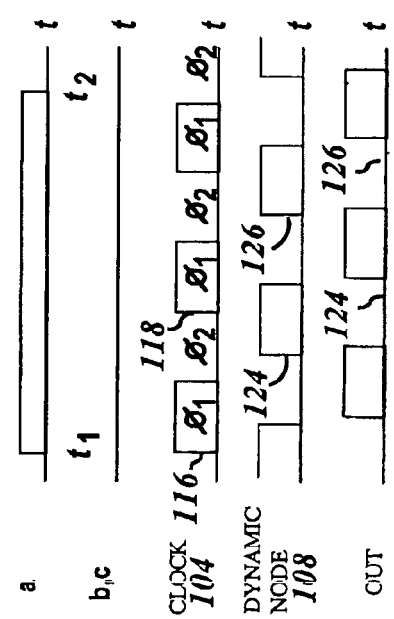
Fig. 1.2

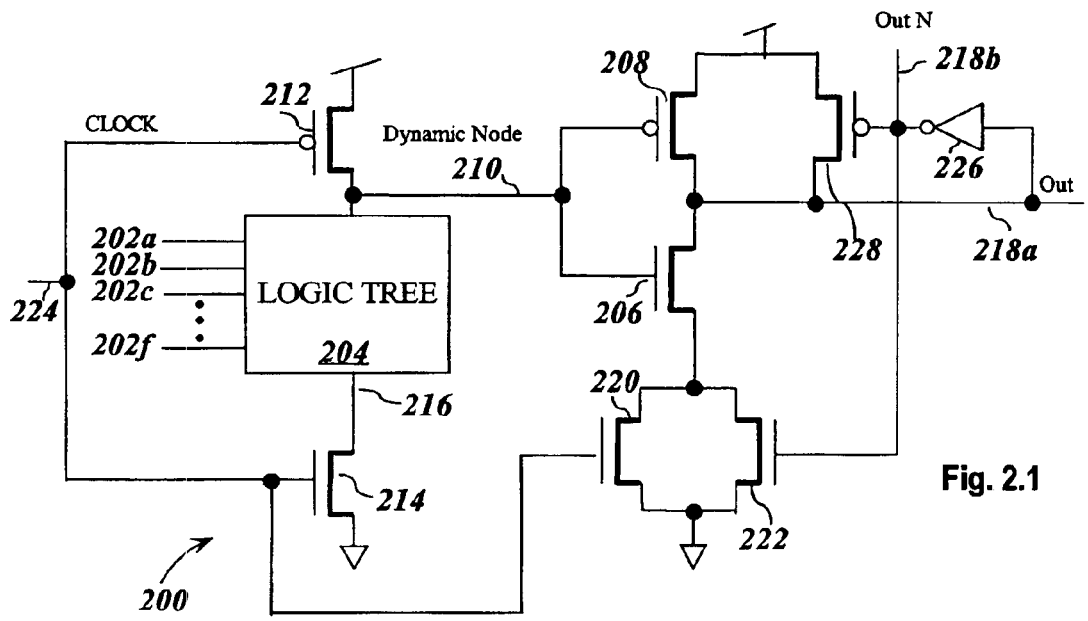
Fig. 2.1
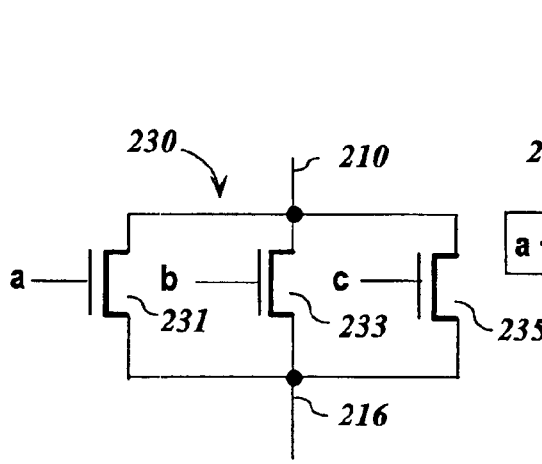
Fig. 2.2.1
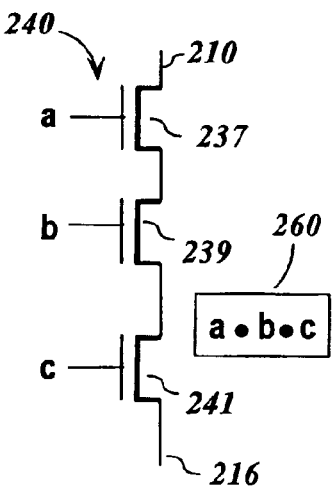
Fig. 2.2.2

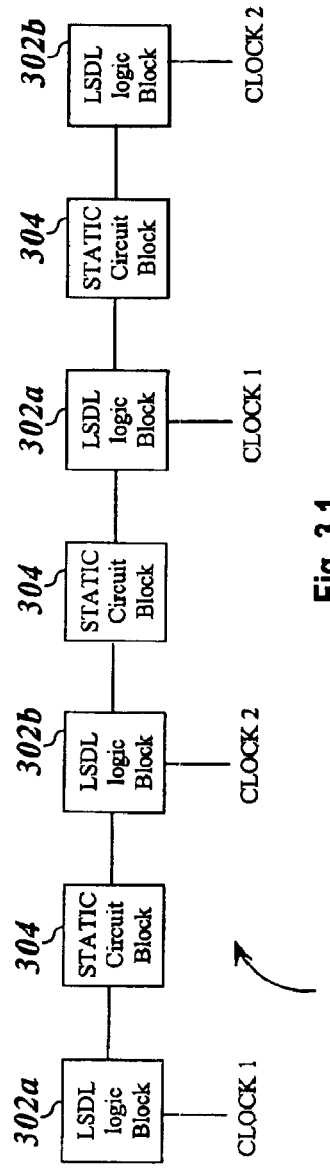
Fig. 3.1
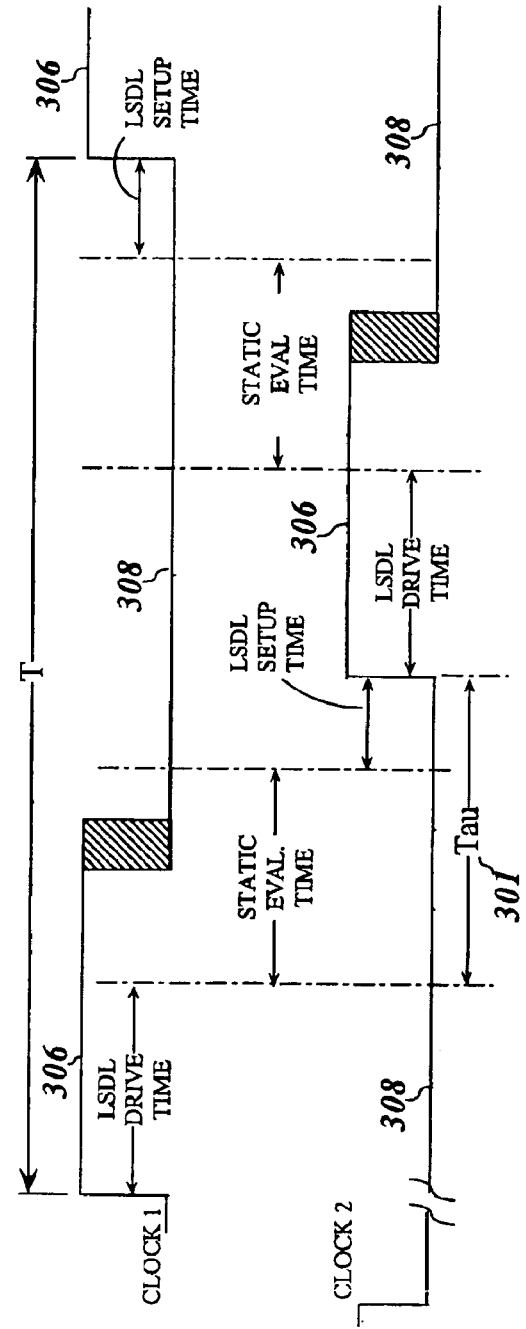
Fig. 3.2

LIMITED SWITCH DYNAMIC LOGIC CIRCUIT WITH KEEPER

CROSS REFERENCE TO RELATED APPLICATION

The present invention is related to the following: U.S. patent application Ser. No. 10/655,376, filed concurrently with this application, entitled "DUO-MODE KEEPER CIRCUIT," and U.S. patent application Ser. No. 10/116,612, filed Apr. 4, 2002, entitled "CIRCUITS AND SYSTEMS FOR LIMITED SWITCH DYNAMIC LOGIC," which are incorporated by reference herein.

TECHNICAL FIELD

The present invention relates in general to metal oxide silicon (MOS) dynamic logic circuits.

BACKGROUND INFORMATION

Modern data processing systems may perform Boolean operations on a set of signals using dynamic logic circuits. Dynamic logic circuits are clocked. During the precharge phase of the clock, the circuit is preconditioned, typically by precharging an internal node (dynamic node) of the circuit by coupling to a power supply rail. During an evaluate phase of the clock, the Boolean function being implemented by the logic circuit is evaluated in response to the set of input signal values appearing on the inputs during the evaluate phase. (For the purposes herein, it suffices to assume that the input signals have settled to their "steady-state" values for the current clock cycle, recognizing that the input value may change from clock cycle to clock cycle.) Such dynamic logic may have advantages in both speed and the area consumed on the chip over static logic. However, the switching of the output node with the toggling of the phase of the clock each cycle may consume power even when the logical value of the output is otherwise unchanged.

This may be appreciated by referring to FIG. 1.1 illustrating an exemplary three-input OR dynamic logic gate, and the accompanying timing diagram, FIG. 1.2. Dynamic logic 100 includes three inputs a, b and c coupled to a corresponding gate of NFETs 102a–102c. During an evaluate phase $N_1$ (116) of clock 104, NFET 106 is active, and if any of inputs a, b or c are active, dynamic node 108 is pulled low, and the output OUT goes "high" via inverter 110. Thus, referring to FIG. 1.2, which is illustrative, at $t_1$, input a goes high during a precharge phase $N_2$ of clock 104. During the precharge phase $N_2$ of clock 104, dynamic node 108 is precharged via PFET 112. Half-latch PFET 114 maintains the charge on dynamic node 108 through the evaluate phase, unless one or more of inputs a, b or c is asserted. In the illustrative timing diagrams in FIG. 1.2, input a is "high" having a time interval $t_1$ through $t_2$ that spans approximately 2½ cycles of clock 104, which includes evaluation phases, 116 and 118. Consequently, dynamic node 108 undergoes two discharge-precharge cycles, 124 and 126. The output node similarly undergoes two discharge-precharge cycles, albeit with opposite phase, 124 and 126. Because the output is discharged during the precharge phase of dynamic node 108, even though the Boolean value of the logical function is "true" (that is, "high" in the embodiment of OR gate 100) the dynamic logic dissipates power even when the input signal states are unchanged.

Additionally, dynamic logic may be implemented in a dual rail embodiment in which all of the logic is duplicated, one gate for each sense of the data. That is, each logic element includes a gate to produce the output signal, and an additional gate to produce its complement. Such implementations may exacerbate the power dissipation in dynamic logic elements, as well as obviate the area advantages of dynamic logic embodiments.

Limited switching dynamic logic (LSDL) circuits produce circuits which mitigate the dynamic switching factor of dynamic logic gates with the addition of static logic devices which serve to isolate the dynamic node from the output node. Co-pending U.S. Patent Application entitled, "CIRCUITS AND SYSTEMS FOR LIMITED SWITCH DYNAMIC LOGIC," Ser. No. 10/116,612 filed Apr. 4, 2002 and commonly owned, recites such circuits. Additionally, LSDL circuits and systems maintain the area advantage of dynamic logic over static circuits, and further provide both logic senses; that is, the output value and its complement.

LSDL circuits do not normally have a keeper circuit coupled to the dynamic node for the purpose of reinforcing the logic one precharge state because it slows the switching from a logic one to a logic zero and may cause a failure given the normal pulse clock. Likewise, a keeper in LSDL would make LSDL vulnerable to late signals which cause a transition from a logic one to a logic zero.

There is, therefore, a need for a circuit that allows the addition of a PFET keeper device that is activated only when needed to maintain the dynamic node at a logic one to prevent charge sharing and to make output switching faster.

SUMMARY OF THE INVENTION

An LSDL circuit has both an output and a complementary output generated by inverting the output with an inverter logic gate. A PFET is added by coupling its drain terminal to the dynamic node. The PFET has its source terminal coupled to the positive power supply voltage and its gate terminal coupled to the complementary output instead of the output. When the dynamic node is precharged to a logic one, the static logic circuitry that generates the output is disabled by the clock signal. This enables the output and the dynamic node to both be at a logic one when the output is a logic one from the previous evaluation cycle. In this case, the complementary output is a logic zero which turns ON the PFET and reinforces the precharge on the dynamic node. If the output is evaluating to a logic zero, then the dynamic node is not changing from its precharge state and the output will transition quickly to a logic zero when the static logic circuit is enabled. If the output is transitioning from a logic zero to a logic one, then the PFET keeper is OFF and does not affect the dynamic node.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which:

FIG. 1.1 illustrates, in partial schematic form, a dynamic logic gate which may be used in conjunction with the present invention;

FIG. 1.2 illustrates a timing diagram corresponding to the logic gate embodiment illustrated in FIG. 1.1;

FIG. 2.1 illustrates, in partial schematic form, a standard LSDL device illustrating the static logic devices for isolating the dynamic node from the output node;

FIG. 2.2.1 illustrates, in partial schematic form, circuitry for incorporation in the logic tree of FIG. 2.1 whereby the logic function performed is the logical OR of three input signals;

FIG. 2.2.2 illustrates, in partial schematic form, another circuit for incorporation in the logic tree of FIG. 2.1 whereby the logic function performed is the logical AND of three input signals;

FIG. 2.3 illustrates a timing diagram corresponding to an embodiment of the dynamic logic device of FIG. 2.1 in which the logic function performed is the logical OR of three input signals;

FIG. 3.1 illustrates, in block diagram form, a limited switch dynamic logic system in accordance with an embodiment of the present invention;

FIG. 3.2 illustrates a two-phase clock which may be used in conjunction with the logic system of FIG. 3.1;

DETAILED DESCRIPTION

Figure 4:
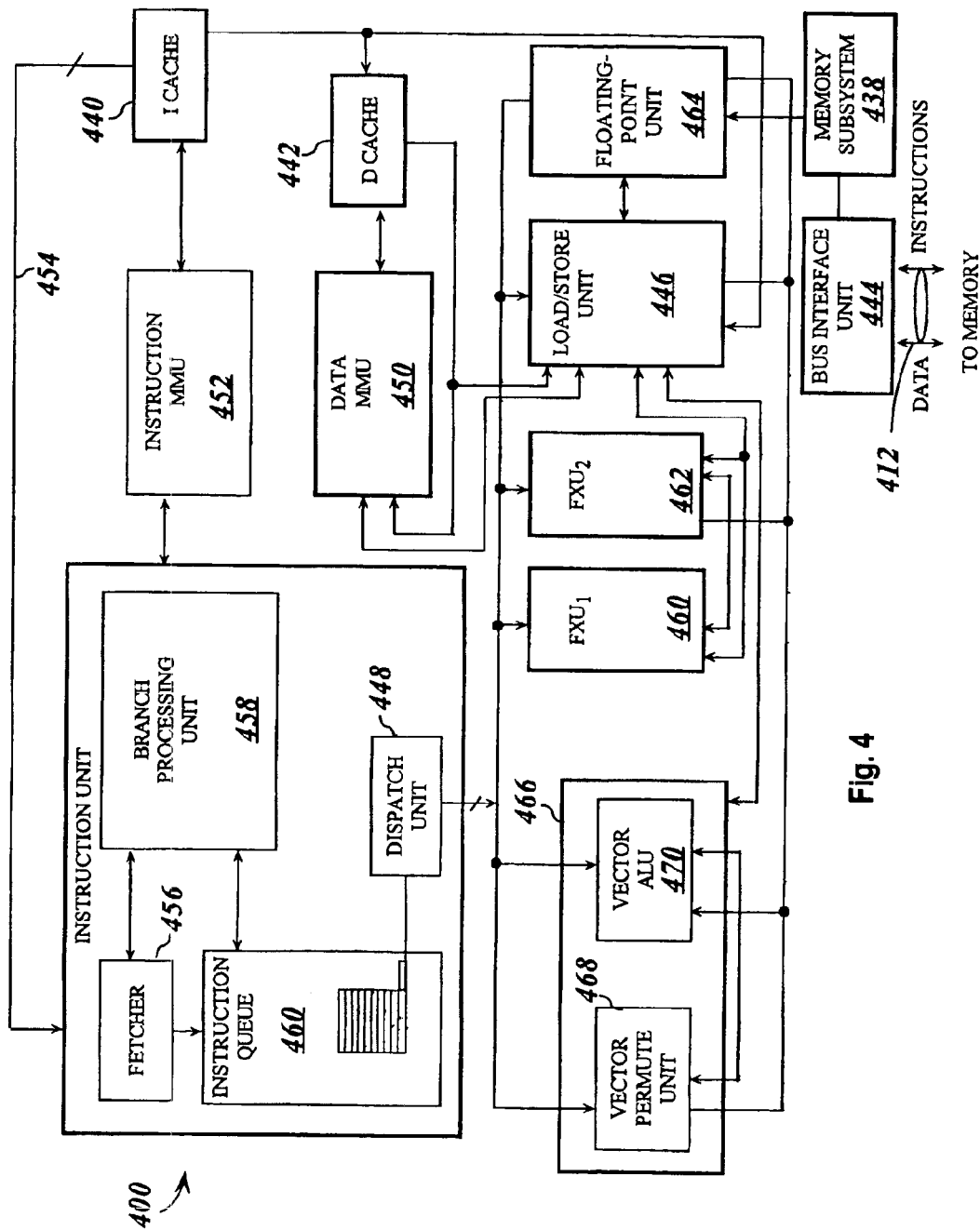
FIG. 4 illustrates a high level block diagram of selected operational blocks within a central processing unit (CPU) incorporating the present inventive principles.

In the following description, numerous specific details are set forth to provide a thorough understanding of the present invention. However, it will be obvious to those skilled in the art that the present invention may be practiced without such specific details. In other instances, well-known circuits may be shown in block diagram form in order not to obscure the present invention in unnecessary detail. For the most part, details concerning timing, data formats within communication protocols, and the like have been omitted inasmuch as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

FIG. 2.1 illustrates a limited switch dynamic logic (LSDL) device 200 used in accordance with the present inventive principles. In general, LSDL device 200 receives a plurality, n, of inputs 202a . . . 202f provided to logic tree 204, and outputs a Boolean combination of the inputs. The particular Boolean function performed by LSDL device 200 is reflected in the implementation of logic tree 204 (accounting for the inversion performed by the inverter formed by n-channel field effect transistor (NFET) 206 and p-channel field effect transistor (PFET) 208). Logic tree 204 is coupled between the drain of PFET 212 and the drain of NFET 214, node 216. The junction of the logic tree 204 and the drain of PFET 212 forms dynamic node 210.

For example, FIG. 2.2.1 illustrates logic tree 230 including three parallel connected NFETs, 231, 233 and 235. Logic tree 230 may be used to provide a logic device generating the logical NOR of the three input signals coupled to corresponding ones of the gates of NFETs 231, 233 and 235, a, b and c (as indicated by the Boolean expression 250 in FIG. 2.2.1) and accounting for the inversion via NFET 206 and PFET 208. Similarly, FIG. 2.2.2 illustrates a logic tree 240 including three serially connected NFETs 237, 239 and 241. Logic tree 240 may be used in conjunction with the logic device 200 to generate the logical NAND of the three input signals a, b and c (as indicated by the Boolean expression 260 in FIG. 2.2.2).

Returning to FIG. 2.2.1, dynamic node 210 is coupled to the common junction of the gates of NFET 206 and PFET 208 which invert the signal on dynamic node 210. The inversion of the signal on dynamic node 210 is provided on Out 218a. The transistor pair, 206 and 208, is serially coupled to parallel NFETs 220 and 222. NFET 220 is switched by clock signal 224. Thus, during the evaluate phase of clock signal 224, the inverter pair, NFET 206 and PFET 208 are coupled between the supply rails by the action of NFET 220.

The operation of LSDL device 200 during the evaluate phase, $N_1$, may be further understood by referring to FIG. 2.3 illustrating an exemplary timing diagram corresponding to the dynamic logic circuit of FIG. 2.1 in combination with a logic tree embodiment 230 of FIG. 2.2.1. In this way, for purposes of illustration, the timing diagram in FIG. 2.3 is the counterpart to the timing diagram in FIG. 1.2 for the three-input OR gate 100 depicted in FIG. 1.1. As shown, input a is "high" or "true" between $t_1$ and $t_2$. In the evaluate phase, $N_1$ of clock signal 224, dynamic node 210 is pulled down (intervals $T_1$). In these intervals, Out 218a is held high by the action of the inverter formed by transistors 206 and 208, which inverter is active through the action of NFET 220 as previously described. In the intervening intervals, $T_2$, dynamic node 210 is pulled up via the action of the precharge phase, $N_2$ of clock signal 224, and PFET 212. In these intervals, the inverter is inactive as NFET 220 is off. Out 218a is held "high" by the action of inverter 226 and PFET 228. Note also that the output of inverter 226 may provide a complementary output, Out N 218b. (Thus, with respect to the three-input logic trees in FIGS. 2.2.1 and 2.2.2, the corresponding logic device represents a three-input OR gate and a three-input AND gate, respectively.)

Returning to FIG. 2.1, if the logic tree evaluates "high", that is the Boolean combination of inputs 202a. 202d represented by logic tree 204, evaluate high, whereby dynamic node 210 maintains its precharge, Out 218a is discharged via NFET 206 and NFET 220. In the subsequent precharge phase, $N_2$, of clock signal 224, Out 218a is latched via the action of inverter 226 and NFET 222. Thus, referring again to FIG. 2.3, corresponding to the three input OR embodiment of logic device 200 and logic tree 230 (FIG. 2.2.1) at $t_2$ input a falls, and in the succeeding evaluate phase of clock signal 224, dynamic node 210 is held high by the precharge. The inverter pair, NFETs 206 and 208, are active in the evaluate phase of $N_1$, of clock signal 224 because of the action of NFET 220. Consequently, Out 218a falls ($t_3$). In the succeeding precharge phase, $N_2$ of clock signal 224, Out 218a is latched in the "low" state, as previously described.

In this way, LSDL device 200 in FIG. 2.1, may provide a static switching factor on Out 218a, and likewise with respect to the complementary output Out N 218b. It would also be recognized by artisans of ordinary skill that although LSDL device 200, FIG. 2.1, has been described in conjunction with the particular logic tree embodiments of FIG. 2.2.1 and FIG. 2.2.2, the principles of the present invention apply to alternative embodiments having other logic tree implementations, and such alternative embodiments fall within the spirit and the scope of the present invention.

Note too, as illustrated in the exemplary timing diagram in FIG. 2.3, the duty factor of the clock signal may have a value that is less than fifty percent (50%). In such an embodiment, the evaluate phase, $N_1$, of the clock signal may be shorter in duration than the precharge phase, $N_2$. A clock signal having a duty factor less than fifty percent (50%) may be referred to as a pulse (or pulsed) clock signal. Note that a width of the evaluate phase may be sufficiently short that leakage from the dynamic node may be inconsequential. That is, leakage does not affect the evaluation of the node.

In such a clock signal embodiment, the size of the precharge device (PFET 212 in the embodiment of FIG. 2.1) may be reduced. It would be recognized by those of ordinary skill in the art that a symmetric clock signal has a fifty percent (50%) duty cycle; in an embodiment in which the duty cycle of the clock signal is less than fifty percent (50%), the size of the precharge device may be reduced concomitantly. In particular, an embodiment of the present invention may be implemented with a clock signal duty cycle of approximately thirty percent (30%). Additionally, while logic device 200 has been described from the perspective of "positive" logic, alternative embodiments in accordance with the present inventive principles may be implemented in the context of "negative" logic and such embodiments would also fall within the spirit and scope of the present invention.

Figure 6:
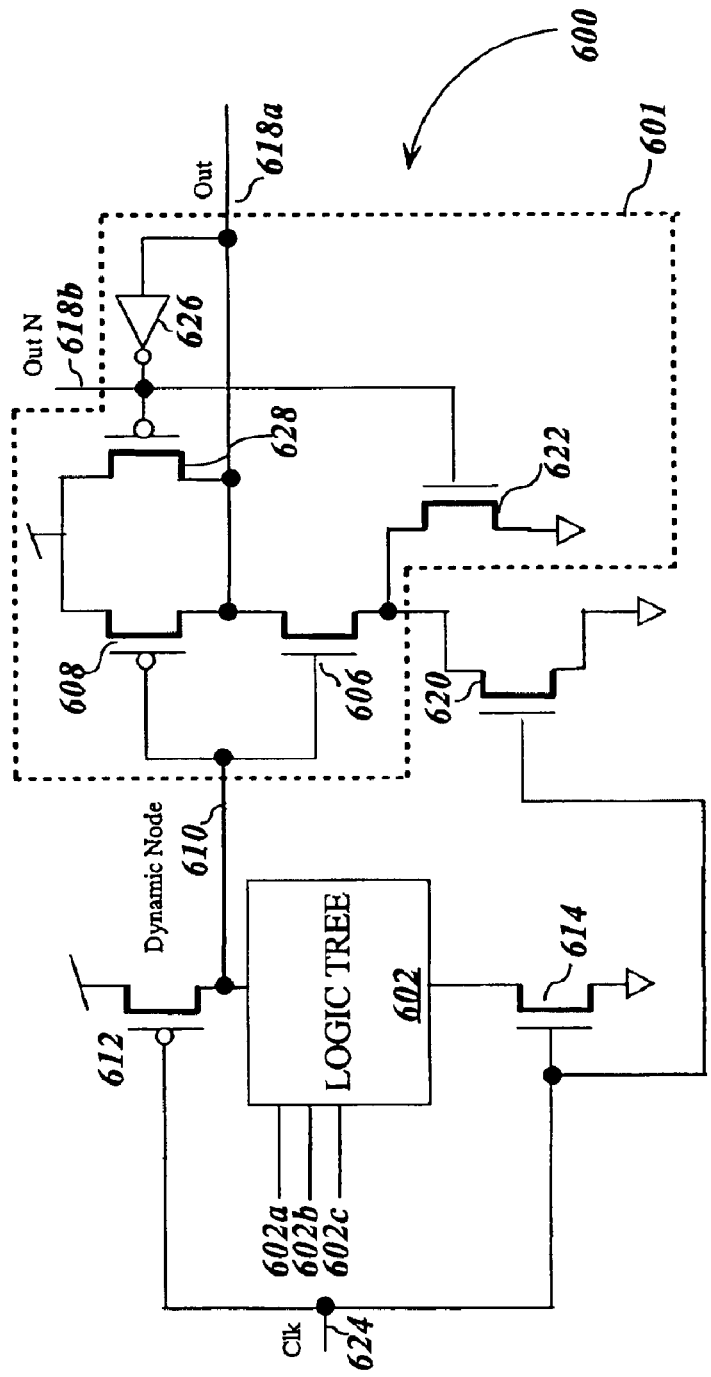
FIG. 6 is a block diagram of an LSDL circuit having an output and a complementary output.

FIG. 6 is an LSDL circuit (LSDL) 600 and is essentially a copy of the embodiment in FIG. 2.1 where logic tree 204 is replaced with a specific three input (602a–602c) logic tree 602. This specific standard LSDL 600 is suitable to practice embodiments of the present invention. Static logic devices 601 are highlighted (dotted lines) to show inputs and outputs that are present in LSDL circuits configured for use with embodiments of the present invention. Clock signal 624 couples to the gates of NFET 614 and PFET 612 as well as NFET 620 in static logic 601. Dynamic node 610 has a logic state determined by logic tree 602 when clock signal 614 is a logic one and a precharge state when clock signal 624 is a logic zero. A half latch is formed by PFET 628 and inverter 626 and is common to circuits in embodiments of the present invention. Out 618a is the logic true output of LSDL 600 and Out N 618b is the complementary output of Out 618a. NFET 622 completes the latch function on the output of LSDL 600 and is a common feedback device in circuits in embodiments of the present invention.

Figure 7:
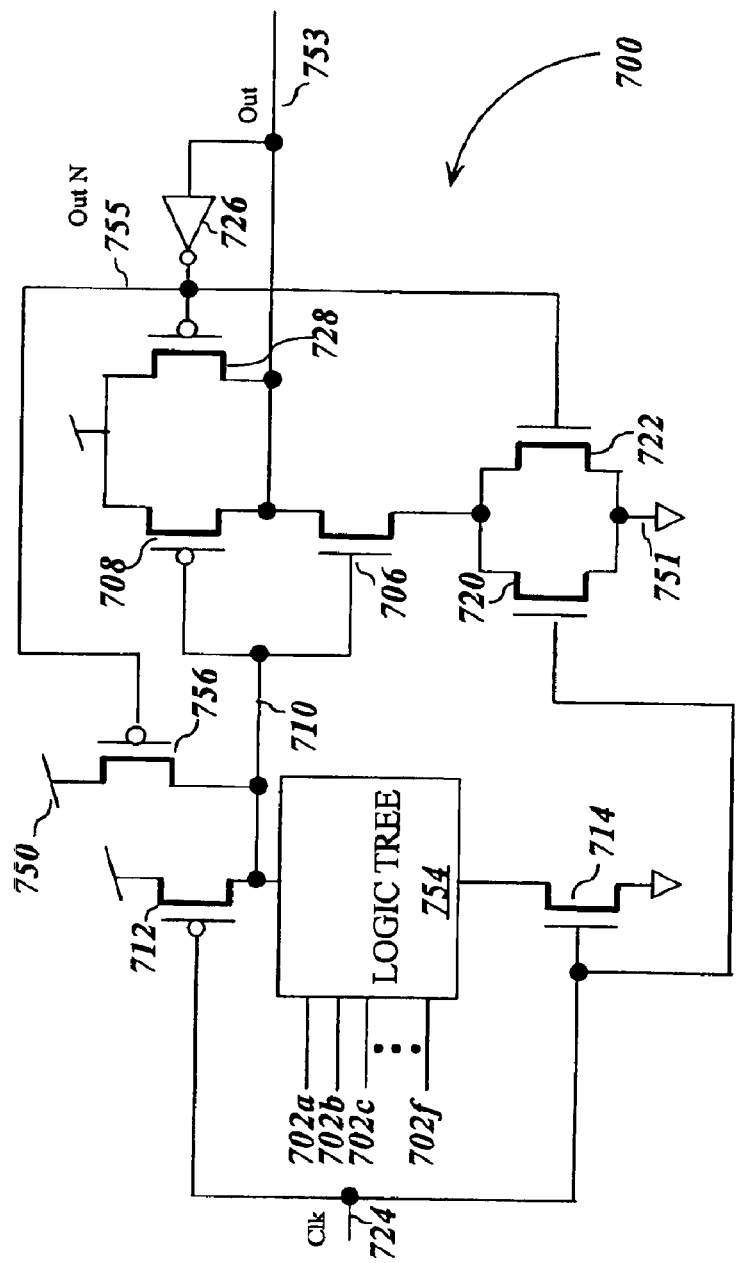
FIG. 7 is a block diagram of an LSDL circuit having a keeper circuit according to embodiments of the present invention.

FIG. 7 is an LSDL circuit 700 having logic inputs 702a–702f and outputs Out 753 and complementary output Out N 755 according to embodiments of the present invention. Static logic devices 706, 708, 720, and 722 are present in LSDL circuits configured according to embodiments of the present invention. Clock signal 724 couples to the gates of NFET 714 and PFET 712 as well as static logic device NFET 720. Dynamic node 710 has a logic state determined by logic tree 754 when clock signal 724 is a logic one and a precharge state when clock signal 724 is a logic zero. A half latch is formed by PFET 728 and inverter 726 and is common to circuits in embodiments of the present invention. Out 753 is the logic true output of LSDL 700 and Out N 755 is the complementary output of Out 753. NFET 722 completes the latch function on the output of LSDL 700 and is a common feedback device in circuits in embodiments of the present invention.

LSDL circuit 700 has a keeper PFET 756 added to the dynamic node 710. Keeper PFET 756 is gated by the complementary output Out N 755 instead of output Out 753. Conventional dynamic logic (e.g., logic gate 100 in FIG. 1.1) usually gates the keeper PFET (e.g., PFET 114) with the normal output of a dynamic logic gate. When logic tree 754 is sampled, dynamic node 710 either stays at its precharged logic one or transitions low to a logic zero. When clock 724 is a logic zero (precharge cycle), NFETs 720 and 722 are OFF if the current value of Out 753 is a logic one. During this time, the inverter formed by PFET 708 and NFET 706 is disabled as its connection to the negative supply voltage is open. Therefore, dynamic node 710 and Out 753 may both be at a logic one in which case dynamic node 710 and Out 753 are both latched to a logic one by the action of inverter 726 and PFET 728 and keeper PFET 756. If logic tree 754 evaluates to a logic one when clock 724 transitions to a logic one, then Out 753 will transition to a logic zero when NFET 720 is enabled by clock 724. In this case, both PFETs 728 and keeper PFET 756 are turned OFF. PFET 756 operates as a keeper only when Out 753 is at a logic one and "may" transition to a logic zero. This allows keeper PFET 756 to hold dynamic node 710 during evaluation (to a logic one) when it is needed. Normally, LSDL circuits do not have a keeper, therefore, charge sharing slows the output transition from a logic one to a logic zero. Embodiments of the present invention remove the vulnerability of LSDL to late signals that cause switching from a logic one to a logic zero and thus improves margins. When Out 753 is a logic zero from a previous cycle and is evaluating to a logic one, then both PFETs, keeper PFET 756 and PFET 728, are OFF and thus PFET 756 does not affect the dynamic node 710. Embodiments of the present invention allow the addition of keeper PFET to LSDL without affecting performance when the keeper is not needed.

FIG. 3.1 illustrates a portion 300 of a data processing system incorporating LSDL circuits in accordance with the present inventive principles. System portion 300 may be implemented using a two-phase clock signal (denoted clock 1 and clock 2). A timing diagram which may be associated with system portion 300 will be discussed in conjunction with FIG. 3.2. LSDL blocks 302b that may be clocked by a second clock signal phase, clock 2, alternates with LSDL block 302a clocked by the first clock signal phase, clock 1. Additionally, system portion 300 may include static logic elements 304 between LSDL blocks. Typically, static circuit blocks 304 may include gain stages, inverters or static logic gates. Static circuit blocks 304 are differentiated from LSDL blocks 302a and 302b as they do not have dynamic nodes that have a precharge cycle. However, alternative embodiments may include any amount of static logic. Additionally, as previously mentioned, an embodiment of system portion 300 may be implemented without static circuit blocks 304.

FIG. 3.2 illustrates a timing diagram which may correspond to a logic system employing a two-phase, pulsed clock signal, such as system portion 300, FIG. 3.1, in accordance with the present inventive principles. The LSDL circuits evaluate during the LSDL evaluate, or drive, portion 306 of their respective clock signals. As previously described, the duty factor of each of clock 1 and clock 2 may be less than fifty percent (50%). The width of the LSDL drive portions 306 of the clock signals need only be sufficiently wide to allow the evaluate node (such as dynamic node 210, FIG. 2.1) to be discharged through the logic tree (for example logic tree 204, FIG. 2.1). As previously described, the duration of the drive portion may be sufficiently narrow that leakage from the evaluation may be inconsequential. Consequently, LSDL circuits are not particularly sensitive to the falling edge of the clock signals, and in FIG. 3.2, the falling portion of the evaluate phase 306 of the clock signals has been depicted with cross-hatching. As noted herein above, the duty factor of clock 1 and clock 2 may be approximately thirty percent (30%) in an exemplary embodiment of the present invention. (It would be appreciated, however, that the present inventive principles may be incorporated in alternative embodiments which have other duty factors.) During the precharge portion 308 of the clock signals, the dynamic node (for example, dynamic node 210, FIG. 2.1) is precharged, as previously discussed. Clock 2 is 180° ($\pi$ radians) out of phase with clock 1 (shifted in time one-half of period T). Thus as shown, the evaluate portion 306 of clock 2 occurs during the precharge phase 308 of clock 1. Because in LSDL circuits, the output states may not change during the evaluate phase of the driving clock signal; the inputs to LSDL blocks, for example, LSDL blocks 302b, FIG. 3.1, are stable during the evaluate phase of the corresponding driving clock signal, clock 2. The time interval, between the end of the evaluate portion 306 of clock 1 and the rising edge of clock 2 may be established by the setup time of the LSDL, and the evaluation time of the static blocks, if any (for example, static blocks 304, FIG. 3.1). The time, Tau 301, together with duty factor may determine the minimum clock signal period for a particular LSDL circuit implementation. Thus, a system portion 300, FIG. 3.1 having a two-phase clock signal effects two dynamic evaluations per period, T, of the driving clock signals. It would be further appreciated by those of ordinary skill in the art that, in general, the present inventive principles may be incorporated in alternative embodiments of an LSDL system having a plurality, n, of clock signal phases. Such alternative embodiments would fall within the spirit and scope of the present invention.

An LSDL system in accordance with the principles of the present invention, such as system 300, FIG. 3.1, may be used, in an exemplary embodiment, in an arithmetic logic unit (ALU). A typical ALU architecture requires a significant number of exclusive-OR (XOR) operations. The XOR of two Boolean values requires having both senses of each of the Boolean values, that is, both the value and its complement ($a \oplus b = ab' + a'b$). As previously described, use of dual rail dynamic logic to implement such functionality obviates the advantages in area and power otherwise obtained by dynamic logic. A data processing system including an ALU embodying the present inventive principles is illustrated in FIG. 4.

FIG. 4 is a high level functional block diagram of selected operational blocks that may be included in a central processing unit (CPU) 400. In the illustrated embodiment, CPU 400 includes internal instruction cache (I-cache) 440 and data cache (D-cache) 442 which are accessible to memory (not shown in FIG. 4) through bus 412, bus interface unit 444, memory subsystem 438, load/store unit 446 and corresponding memory management units: data MMU 450 and instruction MMU 452. In the depicted architecture, CPU 400 operates on data in response to instructions retrieved from I-cache 440 through instruction dispatch unit 448. Dispatch unit 448 may be included in instruction unit 454 which may also incorporate fetch unit 456 and branch processing unit 458 which controls instruction branching. An instruction queue 460 may interface fetch unit 456 and dispatch unit 448. In response to dispatched instructions, data retrieved from D-cache 442 by load/store unit 446 can be operated upon by one of fixed point unit (FXU) 460, FXU 462 or floating point execution unit (FPU) 464. Additionally, CPU 400 provides for parallel processing of multiple data items via vector execution unit (VXU) 466. VXU 466 includes vector permute unit 468 which performs permutation operations on vector operands, and vector arithmetic logic unit (VALU) 470 which performs vector arithmetic operations, which may include both fixed-point and floating-point operations on vector operands. VALU 470 may be implemented using LSDL in accordance with the present inventive principles, and in particular may incorporate LSDL logic systems, of which LSDL system 300, FIG. 3.1 is exemplary.

Figure 5:
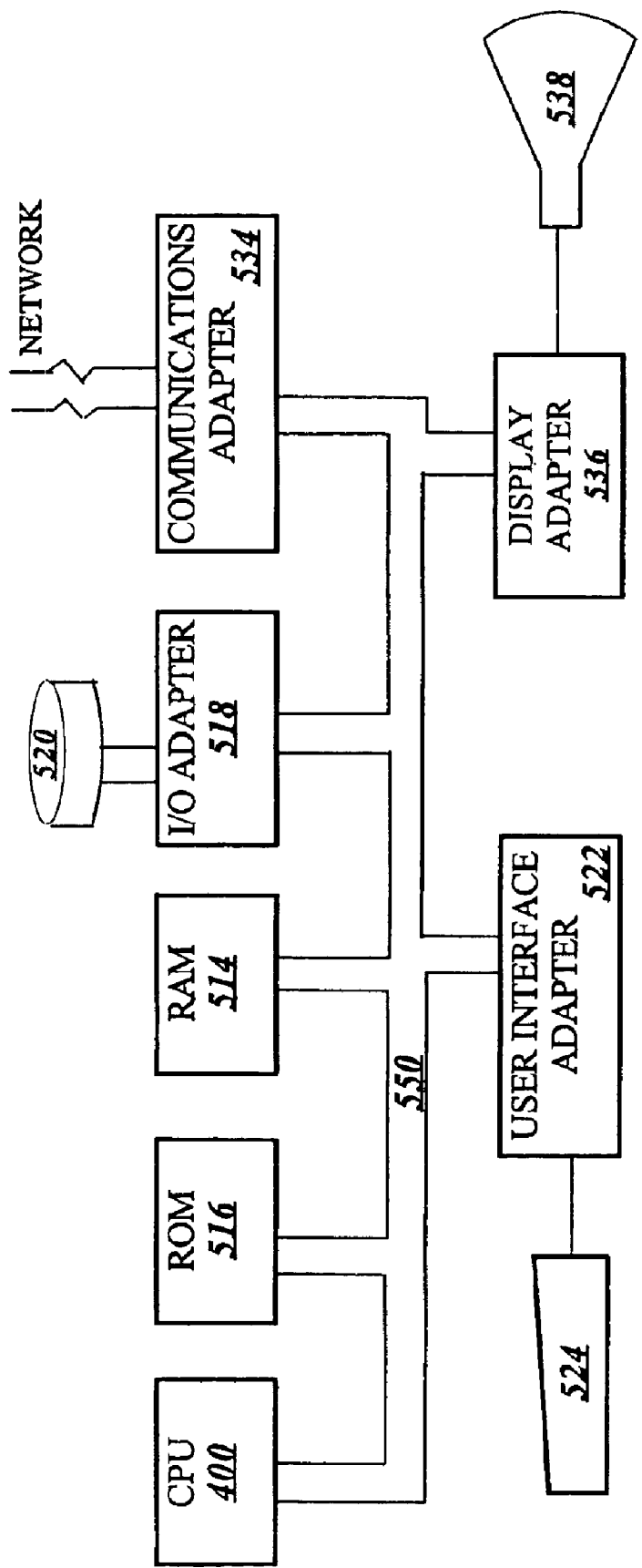
FIG. 5 illustrates a data processing system configured in accordance with the present invention.

A representative hardware environment 500 for practicing the present invention is depicted in FIG. 5, which illustrates a typical hardware configuration of a data processing system in accordance with the subject invention having CPU 400, incorporating the present inventive principles, and a number of other units interconnected via system bus 550. The data processing system shown in FIG. 5 includes random access memory (RAM) 514, read only memory (ROM) 516, and input/output (I/O) adapter 518 for connecting peripheral devices such as disk units 520 to bus 550, user interface adapter 522 for connecting keyboard 524, mouse 526, and/or other user interface devices such as a touch screen device (not shown) to bus 550, communication adapter 534 for connecting the system to a data processing network, and display adapter 536 for connecting bus 550 to display device 538. Note that CPU 400 may reside on a single integrated circuit.

Although the present invention and its advantages have been described in detail, it should be understood that various changes, substitutions and alterations can be made herein without departing from the spirit and scope of the invention as defined by the appended claims.

What is claimed is:

1. A dynamic logic circuit having an output and a complementary output comprising:

a first electronic switch having an input terminal coupled to a clock signal, a first terminal coupled to a positive power supply voltage and a second terminal coupled to a dynamic node of said dynamic logic circuit, wherein said dynamic node is coupled to said positive power supply voltage in response to a first logic state of a clock signal and isolated from said positive power supply voltage in response to a second logic state of said clock signal;

a logic tree having a plurality of logic inputs, a positive tree terminal coupled to said dynamic node and a negative tree terminal, wherein said positive tree terminal is coupled to said negative tree terminal in response to a first combination of logic states of said plurality of logic inputs and isolated from said negative tree terminal in response to a second combination of logic states of said plurality of logic inputs;

a second electronic switch having an input coupled to said clock signal, a first terminal coupled to said negative tree terminal and second terminal coupled to a negative power supply voltage, wherein said negative tree terminal is coupled to said negative power supply voltage in response to said second logic state of a clock signal and isolated from said positive power supply voltage in response to a first logic state of said clock signal;

a keeper circuit having a power supply terminal coupled to a positive power supply voltage, a keeper output coupled to said dynamic node, a keeper input coupled to said complementary output, wherein said keeper circuit reinforces a second logic state on said dynamic node only when said dynamic node evaluates to the logic one state and said output is the logic one state before transitioning to the logic zero state; and static output logic circuitry having an input coupled to said dynamic node, a static output generating said output, an inverted static output generating said complementary output, and an enable terminal, wherein said enable terminal is coupled to said negative power supply voltage by a third electronic switch in response to said second logic state of said clock signal and by a fourth electronic switch in response to said second logic state of said complementary output.

2. The dynamic logic circuit of claim 1, wherein said keeper circuit comprises a P channel field effect transistor (PFET) having a gate terminal coupled to said complementary output, a source terminal coupled to said power supply terminal and a drain terminal coupled to said keeper output.

3. The dynamic logic circuit of claim 1, wherein said complementary output is generated by inverting said output using an inverter logic gate.

4. A logic device comprising:
a plurality of dynamic logic circuits wherein each of said dynamic logic circuits has a first electronic switch having an input terminal coupled to a clock signal, a first terminal coupled to a positive power supply voltage and a second terminal coupled to a dynamic node of said dynamic logic circuit, wherein said dynamic node is coupled to said positive power supply voltage in response to a first logic state of a clock signal and isolated from said positive power supply voltage in response to a second logic state of said clock signal, a logic tree having a plurality of logic inputs, a positive tree terminal coupled to said dynamic node and a negative tree terminal, wherein said positive tree terminal is coupled to said negative tree terminal in response to a first combination of logic states of said plurality of logic inputs and isolated from said negative tree terminal in response to a second combination of logic states of said plurality of logic inputs, a second electronic switch having an input coupled to said clock signal, a first terminal coupled to said negative tree terminal and second terminal coupled to a negative power supply voltage, wherein said negative tree terminal is coupled to said negative power supply voltage in response to said second logic state of a clock signal and isolated from said positive power supply voltage in response to a first logic state of said clock signal, a keeper circuit having a power supply terminal coupled to a positive power supply voltage, a keeper output coupled to said dynamic node, a keeper input coupled to said complementary output, wherein said keeper circuit reinforces a first logic state on said dynamic node only when said dynamic node evaluates to the logic one state and said output is the logic one state before transitioning to the logic zero state, and static output logic circuitry having an input coupled to said dynamic node, a static output generating said output, an inverted static output generating said complementary output, and an enable terminal, wherein said enable terminal is coupled to said negative power supply voltage by a third electronic switch in response to said second logic state of said clock signal and by a fourth electronic switch in response to said second logic state of said complementary output.

5. The dynamic logic circuit of claim 4, wherein said keeper circuit comprises a P channel field effect transistor (PFET) having a gate terminal coupled to said complementary output, a source terminal coupled to said power supply terminal and a drain terminal coupled to said keeper output.

6. The dynamic logic circuit of claim 4, wherein said complementary output is generated by inverting said output using an inverter logic gate.

7. A data processing system comprising:
a central processing unit (CPU); and
a memory operable for communicating instructions and operand data to said CPU, wherein said CPU includes a logic system having a logic device, said logic device including a plurality of dynamic logic circuits wherein each of said dynamic logic circuits has a first electronic switch having an input terminal coupled to a clock signal, a first terminal coupled to a positive power supply voltage and a second terminal coupled to a dynamic node of said dynamic logic circuit, wherein said dynamic node is coupled to said positive power supply voltage in response to a first logic state of a clock signal and isolated from said positive power supply voltage in response to a second logic state of said clock signal, a logic tree having a plurality of logic inputs, a positive tree terminal coupled to said dynamic node and a negative tree terminal, wherein said positive tree terminal is coupled to said negative tree terminal in response to a first combination of logic states of said plurality of logic inputs and isolated from said negative tree terminal in response to a second combination of logic states of said plurality of logic inputs, a second electronic switch having an input coupled to said clock signal, a first terminal coupled to said negative tree terminal and second terminal coupled to a negative power supply voltage, wherein said negative tree terminal is coupled to said negative power supply voltage in response to said second logic state of a clock signal and is isolated from said positive power supply voltage in response to a first logic state of said clock signal, a keeper circuit having a power supply terminal coupled to a positive power supply voltage, a keeper output coupled to said dynamic node, a keeper input coupled to said complementary output, wherein said keeper circuit reinforces a first logic state on said dynamic node only when said dynamic node evaluates to the logic one state and said output is the logic one state before transitioning to the logic zero state., and static output logic circuitry having an input coupled to said dynamic node, a static output generating said output, an inverted static output generating said complementary output, and an enable terminal, wherein said enable terminal is coupled to said negative power supply voltage by a third electronic switch in response to said second logic state of said clock signal and by a fourth electronic switch in response to said second logic state of said complementary output.

8. The data processing system of claim 7 wherein said keeper circuit comprises a P channel field effect transistor (PFET) having a gate terminal coupled to said complementary output, a source terminal coupled to said power supply terminal and a drain terminal coupled to said keeper output.

9. The data processing system of claim 7 wherein said complementary output is generated by inverting said output using an inverter logic gate.

10. A dynamic logic circuit having an output and a complementary output comprising:
a dynamic node;
precharge circuitry coupled to said dynamic node for precharging the dynamic node to a logic one during a precharge cycle of a clock signal;
a logic tree coupled to said dynamic node for evaluating said dynamic node to a logic one or a logic zero in response to combinations of logic states of plurality of logic inputs coupled to said logic tree during an evaluation cycle of said clock signal;

static logic circuitry for latching logic states of said dynamic node and holding said logic states during said precharge cycle of said clock signal, wherein said static logic circuitry generates said output and said complementary output; and a keeper circuit having a power supply terminal coupled to a power supply voltage, a keeper input coupled to said complementary output and a keeper output coupled to said dynamic node, wherein said keeper output reinforces a logic one state on said dynamic node only when said dynamic node evaluates to the logic one state and said output is the logic one state before transitioning to the logic zero state.

11. A dynamic logic circuit having an output and a complementary output comprising:

a dynamic node;

precharge circuitry coupled to said dynamic node for precharging the dynamic node to a logic one during a precharge cycle of a clock signal;

a logic tree coupled to said dynamic node for evaluating said dynamic node to a logic one or a logic zero in response to combinations of logic states of plurality of logic inputs coupled to said logic tree during an evaluation cycle of said clock signal;

static logic circuitry for latching logic states of said dynamic node and holding said logic states during said precharge cycle of said clock signal, wherein said static logic circuitry generates said output and said complementary output; and a keeper P channel field effect transistor (PFET) having a gate terminal coupled to said complementary output, a source terminal coupled to a power supply voltage and a drain terminal as a keeper output coupled to said dynamic node, wherein said keeper output reinforces a logic one state on said dynamic node only when said dynamic node evaluates to the logic one state and said output is the logic one state before transitioning to the logic zero state.

* * * * *